United States Patent
Klonowski et al.

(10) Patent No.: US 11,085,376 B2
(45) Date of Patent: Aug. 10, 2021

(54) INTEGRATION OF A PHASE-CHANGE MATERIAL FOR LIMITING THE TEMPERATURE OF FUEL FROM AN ELECTRONIC MODULE

(71) Applicant: SAFRAN HELICOPTER ENGINES, Bordes (FR)

(72) Inventors: Thomas Klonowski, Moissy-Cramayel (FR); Camel Serghine, Moissy-Cramayel (FR)

(73) Assignee: SAFRAN HELICOPTER ENGINES, Bordes (FR)

( * ) Notice: Subject to any disclaimer, the term of this patent is extended or adjusted under 35 U.S.C. 154(b) by 132 days.

(21) Appl. No.: 16/309,137

(22) PCT Filed: Jun. 12, 2017

(86) PCT No.: PCT/FR2017/051506
§ 371 (c)(1),
(2) Date: Dec. 12, 2018

(87) PCT Pub. No.: WO2017/216462
PCT Pub. Date: Dec. 21, 2017

(65) Prior Publication Data
US 2019/0309687 A1    Oct. 10, 2019

(30) Foreign Application Priority Data

Jun. 13, 2016 (FR) ...................... 1655451

(51) Int. Cl.
*F02C 7/224*    (2006.01)
*B64D 37/34*    (2006.01)
(Continued)

(52) U.S. Cl.
CPC .............. *F02C 7/224* (2013.01); *B64D 37/34* (2013.01); *F02C 9/263* (2013.01);
(Continued)

(58) Field of Classification Search
CPC . F02C 7/224; F02C 7/16; B64D 37/34; F05D 2260/207
See application file for complete search history.

(56) References Cited

U.S. PATENT DOCUMENTS 6,182,435 B1 * 2/2001 Niggemann ........... B64D 41/00
60/266
6,400,896 B1 * 6/2002 Longardner ............ F28D 20/02
126/400
(Continued)

FOREIGN PATENT DOCUMENTS

WO    2014/105331 A1    7/2014

OTHER PUBLICATIONS

Communication dated May 17, 2017 from French Patent Office in counterpart FR Application No. 1655451.
(Continued)

*Primary Examiner* — Todd E Manahan
*Assistant Examiner* — Katheryn A Malatek
(74) *Attorney, Agent, or Firm* — Sughrue Mion, PLLC

(57) ABSTRACT

The invention concerns an assembly comprising: a fuel supply circuit (15, 15a, 15b) configured to supply fuel to a turbine heat engine, an electronic module (14, 14a, 14b), a power source (13, 13a, 13b) for supplying power to the electronic module (14, 14a, 14b), and a heat exchanger (16, 16a, 16b) positioned to allow a flow of heat from the electronic module (14, 14a, 14b) to the fuel supply circuit (15, 15a, 15b), the assembly being characterised in that the electronic module (14, 14a, 14b) comprises a phase-change material (PCM), configured to change state when the temperature of same reaches a predetermined phase-change temperature (Tf).

17 Claims, 5 Drawing Sheets

Figure 1:
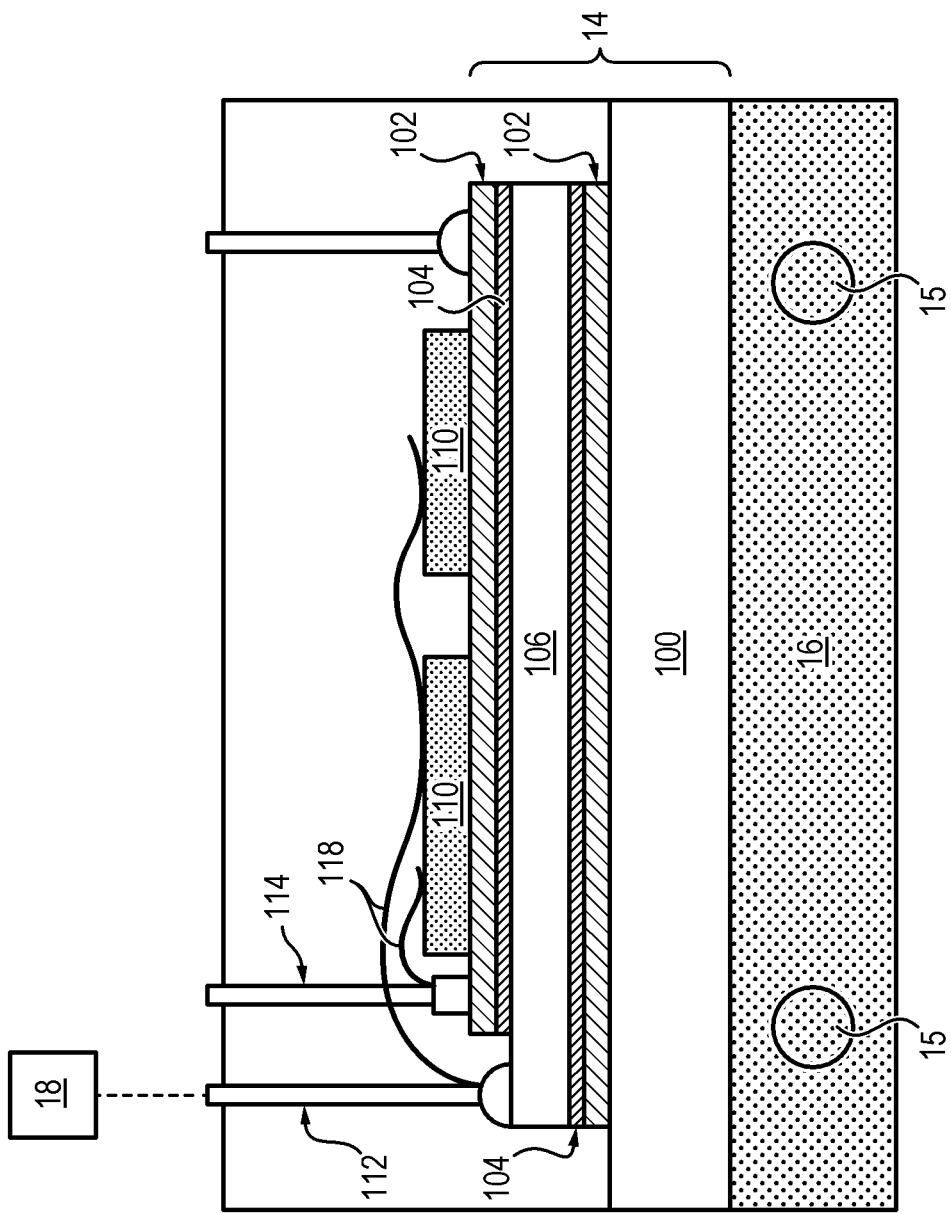

(51) Int. Cl.
    *F02C 9/26*         (2006.01)
    *H01L 25/07*       (2006.01)
    *H01L 23/427*     (2006.01)
    *H01L 25/16*       (2006.01)
    *H01L 23/373*     (2006.01)
    *H01L 25/18*       (2006.01)
    *H01L 23/498*     (2006.01)

(52) U.S. Cl.
    CPC ........ *H01L 23/3735* (2013.01); *H01L 23/427* (2013.01); *H01L 25/072* (2013.01); *H01L 25/16* (2013.01); *H01L 25/18* (2013.01); *F05D 2260/207* (2013.01); *F05D 2260/213* (2013.01); *H01L 23/49861* (2013.01); *H01L 2224/48139* (2013.01); *H01L 2224/73265* (2013.01); *Y02T 50/60* (2013.01)

(56) References Cited

U.S. PATENT DOCUMENTS

2012/0240593 A1    9/2012  Macfarlane
2013/0147050 A1*  6/2013  Bonner, III ........... H01L 23/367
                                                            257/773

OTHER PUBLICATIONS

International Search Report for PCT/FR2017/051506, dated Sep. 4, 2017.

* cited by examiner

INTEGRATION OF A PHASE-CHANGE MATERIAL FOR LIMITING THE TEMPERATURE OF FUEL FROM AN ELECTRONIC MODULE

CROSS REFERENCE TO RELATED APPLICATIONS

This Application is a National Stage of International Application No. PCT/FR2017/051506 filed Jun. 12, 2017, claiming priority based on French Patent Application No. 1655451 filed Jun. 13, 2016, the disclosures of each of which are herein incorporated by reference in their entireties.

GENERAL TECHNICAL FIELD

The invention relates to supplying a power unit with fuel, and in particular managing the phase status of the fuel.

More specifically, the invention relates to power units comprising a heat engine and an electrical machine.

In the present context "turbine heat engine" means any machine enabling conversion of the heat energy of a working fluid into mechanical energy by expanding said working fluid in a turbine.

More particularly, this working fluid can be a combustion gas resulting from the chemical reaction of fuel with air in a combustion chamber, after compression of this air in a compressor actuated by the turbine via a first rotary shaft.

In this way, the turbine heat engines, such as understood in the present context, comprise single- or dual-flow turbojets, turboprops, turboengines or gas turbines, inter alia.

In the following description the terms "upstream" and "downstream" are defined relative to the normal direction of circulation of the working fluid in the turbomachine.

Fuel supplying turbine heat engines can include impurities, and especially water in suspension. At normal temperatures the presence of traces of water in the fuel is not a major problem. Yet when temperatures are low, this water can freeze. The resulting particles of ice can possibly block passage of the fuel, especially when accumulating at the intake of filters typically used to prevent the passage of other solid impurities. As a consequence, this icing in the fuel circuit should be prevented.

PRIOR ART

A first solution against fuel freezing consists of adding in, costly, toxic and restrictive additives. This solution is willingly set aside.

As presented in document US 20120240593, a second solution consists of recovering heat discharged by an electronic circuit, in this case an electronic circuit for power conversion (GCU for "Generator Control Unit"), for heating the fuel and preventing the latter from freezing. A heat exchanger performs heat transfers.

The GCU operates as a radiator.

In the abovementioned document, managing heat transfer between the GCU and the fuel is achieved by control of the fluid flow or by addition of an additional dedicated electric radiator which both generates additional heat and stresses the GCU more, which in turn heats more.

But there is a risk, not mentioned in the above document, that the fuel receives too much energy and may reach its vaporisation temperature. In fact, some on-board electronics function over very short periods, which involves high energy. Furthermore, the voltage used, often of the order of a few tens of volts, causes very high amperage levels, resulting in generating considerable heat.

This vaporisation phenomenon must be strictly avoided.

PRESENTATION OF THE INVENTION

The aim of the invention is to rectify the above disadvantages by proposing an assembly comprising:
- A fuel supply circuit configured to supply a turbine heat engine with fuel,
- An electronic module,
- A power source for supplying the electronic module with electricity,
- A heat exchanger positioned to allow heat flow from the electronic module to the fuel supply circuit, the assembly being characterized in that the electronic module comprises a phase-change material (PCM), configured to change state when its temperature reaches a predetermined phase change temperature.

Thanks to the PCM material, the rise in temperature is better diffused over time, which limits temperature peaks and prevents the vaporisation temperature of the fuel being reached.

Also, the PCM material protects the electronic module from these temperature peaks which can damage it.

The PCM material accordingly distributes the heat flow in an optimized manner between the electronic module and the fuel.

To prevent the fuel from vaporising, the phase change temperature of the PCM material is selected so as to be less than the vaporisation temperature of said fuel which is circulating in the fuel supply circuit.

The invention can comprise the following characteristics, taken singly or in combination:
- said predetermined phase change temperature is less than the vaporisation temperature of the fuel,
- the electronic module is an electronic power module, configured to convert the energy supplied by the power source,
- the phase change temperature is less than 150° C., preferably less than 140° C.
- the electronic module comprises the following elements:
  a base substrate forming a support,
  electronic components, positioned on the support,
and wherein the exchanger is located relative to the base substrate to the side opposite the components,
- the electronic components are encapsulated in the phase-change material PCM,
- phase-change material PCM is integrated into the base substrate,
- the electronic module comprises a cold plate, and wherein phase-change material is integrated into the cold plate.
- the cold plate is positioned between the base substrate and the heat exchanger,
- the heat exchanger is integrated into the cold plate, The invention also proposes a power unit comprising:
A turbine heat engine,
An assembly such as described previously,
wherein the fuel supply circuit is configured to supply the heat engine.

The power source is advantageously an electrical machine which can operate as an engine or generator and wherein the electrical machine is coupled mechanically to a rotating shaft of the heat engine.

The invention also proposes a method for heating fuel using an assembly or a power unit such as described previously, wherein the fuel is heated in the heat exchanger of the fuel supply circuit by the heat emitted by the electronic module via the phase-change material PCM.

The invention also proposes the use of phase-change material PCM to control heat transfer between on the one hand an electronic module discharging heat when it is supplied with power, and on the other hand, a fuel for a gas turbine, by means of a heat exchanger.

PRESENTATION OF FIGURES

Figure 2:
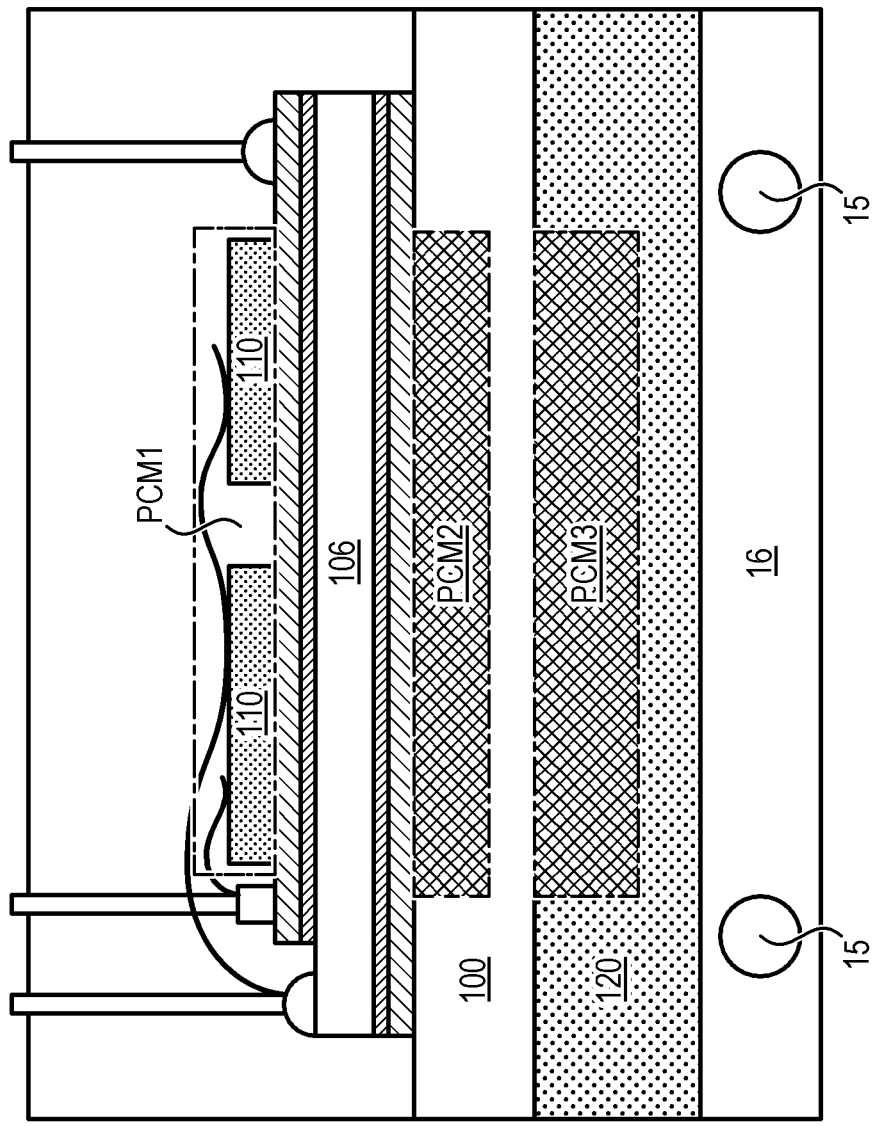
Figure 3:
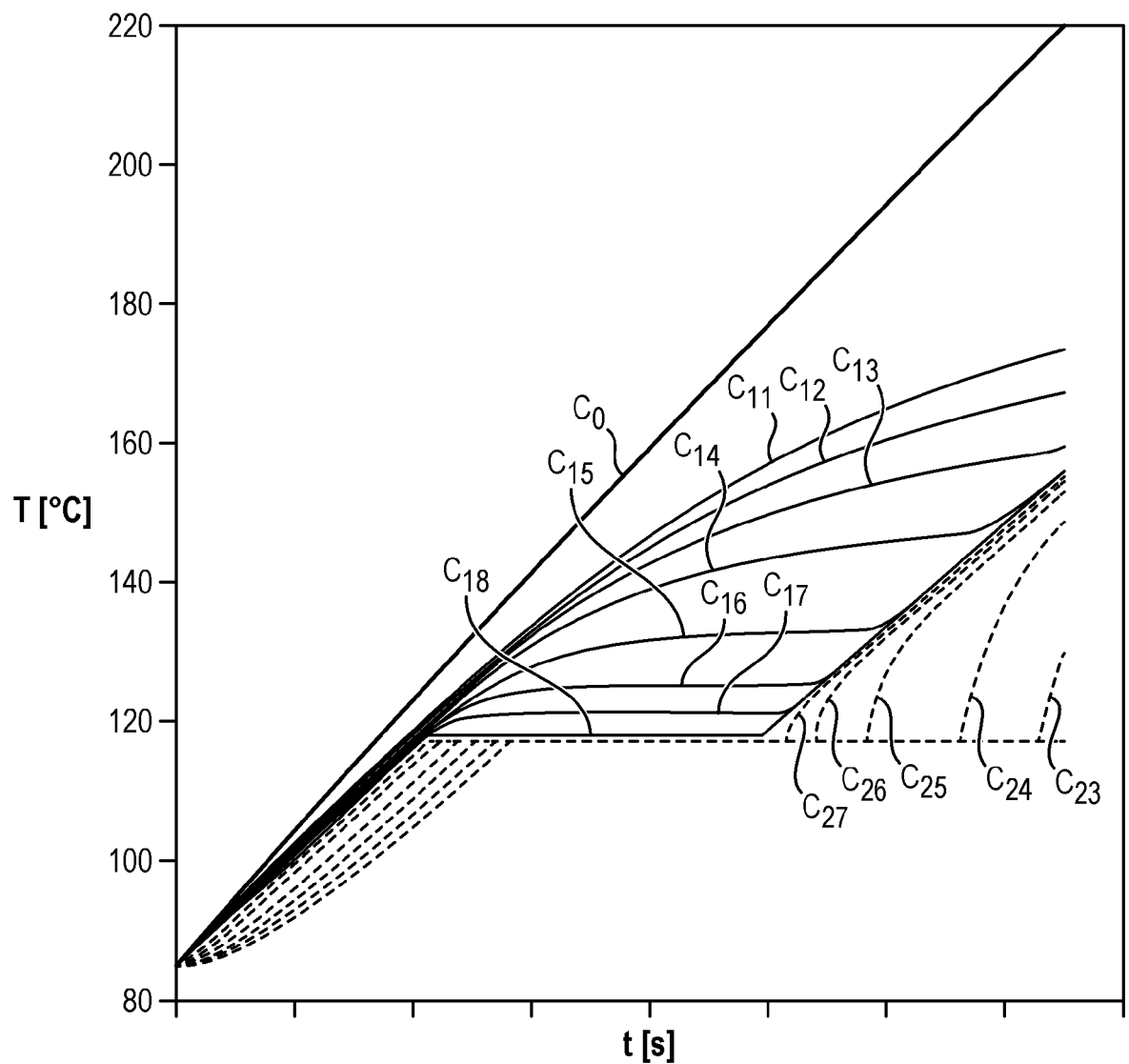
Figure 4:
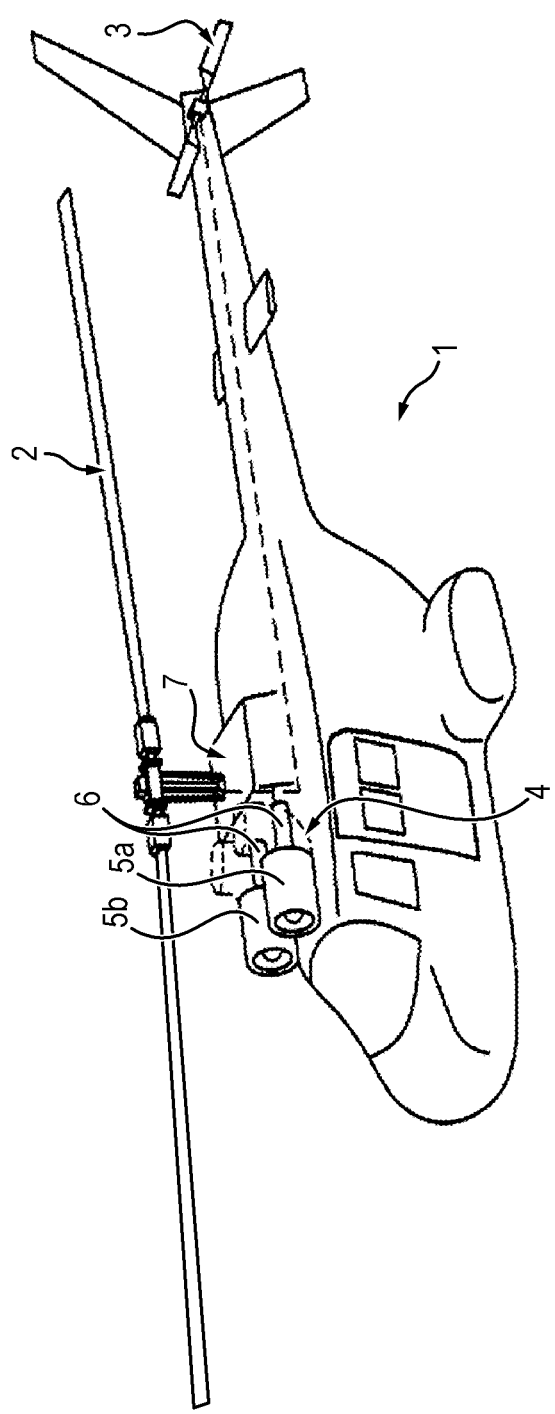
Figure 5:
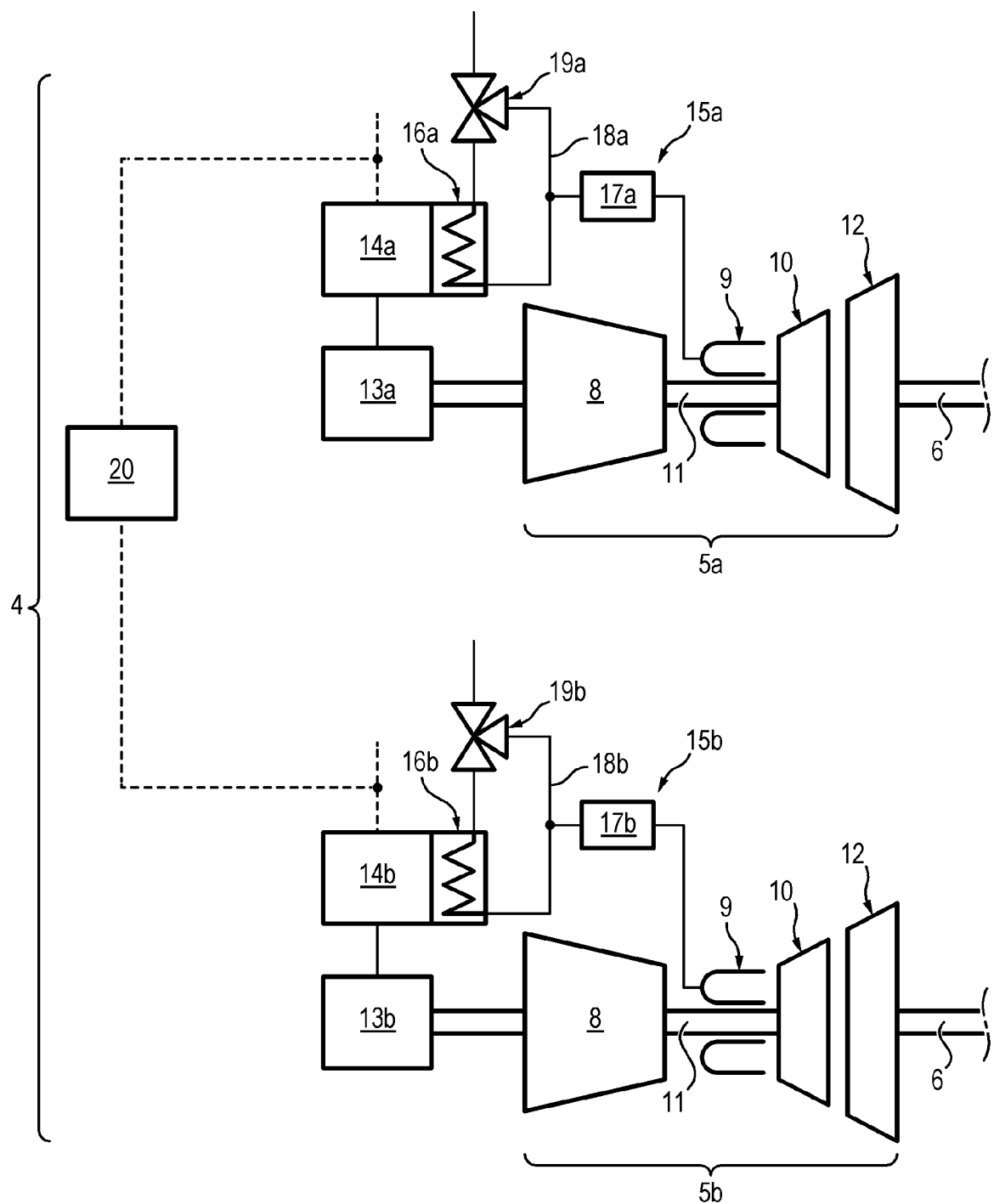

Other characteristics, aims and advantages of the invention will emerge from the following description which is purely illustrative and non-limiting and which must be considered with respect to the appended drawings, in which:

FIG. 1 schematically illustrates an electronic power module and a heat exchanger of a power unit, shown without PCM material for clarity, FIG. 2 is similar to FIG. 1, but with three variants for integrating PCM material, and with addition of a cold plate, FIG. 3 shows temperature curves relative to the use of PCM material, FIG. 4 schematically illustrates an aircraft with a power unit comprising two turboengines and two electric engines-generators, FIG. 5 illustrates this power unit more specifically.

DETAILED DESCRIPTION

In reference to FIG. 1, an assembly is defined comprising a fuel supply circuit 15, an electronic module 14 and a power source 13 which contributes power, typically electricity, to the module 14.

The function of the fuel supply circuit 15 is to supply a turbine heat engine with fuel. Particular embodiments will be detailed hereinbelow.

The electronic module 14 generally comprises at least one electronic circuit to which electronic components are connected together capable of processing electric signals (information or power).

Consequently, when requested by the power source 13, the module 14 discharges heat. A heat exchanger 16 is provided for this heat to be transmitted to the fuel supply circuit 15. Typically, the heat exchanger 16 is positioned between the electronic module 14 and the fuel supply circuit 15a, 15b.

The heat exchanger 16 optimizes the heat flow between the module 14 and the supply circuit 15. It can take different forms, such as a plate exchanger, a fin exchanger, or simply be in the form of pipe branches favouring heat exchange.

In an embodiment the electronic module 14 comprises a base substrate 100 forming a support on which electronic components 110 are fixed, such as bipolar insulated gate transistors, diodes, condensers, inductances, etc. As shown in FIG. 1, these components 110 can need transmitters 112, ports 114, a collector 116 and linking wires 118 for example.

Different layers of materials, such as a brazed joint 102, a copper sole 104, another insulating substrate 106, for example ceramic, to make interconnections between the semi-conductors and with external circuits on the copper sole 104, are conventionally provided for operating the electronic module.

To better regulate power transfer, the electronic module 14 comprises a phase-change material, referenced PCM. FIG. 2 shows various embodiments to be detailed hereinbelow.

PCM materials change state, generally from the solid state to the liquid state, as soon as their melting temperature is reached. As there are also PCM materials which change phase from a solid or liquid state to a gaseous state, a phase change temperature Tf is more generally defined.

This temperature Tf is a characteristic of the PCM material.

In some flight phases of an aircraft, the electric power demand of an electric system can be very high over periods which not exceeding a few tens of seconds or even a minute. In these conditions where considerable heat dissipation is required but which is cyclic or transitory, the use of PCM materials allows better management of the heat equipment closest to the critical electronic components 110 such as static components, condensers, self, etc.

Indeed, reaching its melting temperature therefore by shifting from the solid state to the state liquid the PCM material will absorb a quantity of heat but remain at the same temperature (the time for all the material to have changed state) and heat transfer will then operate between the electronic components 110 inside the electronic module 14 and this PCM material. This absorption is linked to the enthalpy of change of state of the PCM material, also called latent heat, which corresponds to the power to be received per unit of mass of the material to change state.

The PCM material will absorb the temperature peak.

Indeed, one of the main problems of developing electronics on board aircraft is that of the temperature stability of electronic components 110 especially those which are brazed or welded to the substrate 100. Indeed, thermomechanical stresses between the component 110 and the substrate 100 can in some cases cause delamination of the brazing or weld of the component on its substrate, which can destroy the component. Such uses of PCM material are already known, as in document US 20130147050.

PCM material also allows gains in sizing and occupied volume. Indeed, electronic components 110 such as transistors, condensers, selfs, can be dimensioned not on a maximal temperature peak but on an averaged lower temperature.

Consequently, the PCM material has a first role, which is to absorb heat to prevent the electronic module 14 from exceeding a critical temperature. FIG. 3 illustrates this absorption as a function of time: the curve C0 represents the rise in temperature of the electronic module 14 in the absence of PCM material, the curves C11 to C18 represent the rise in temperature of the electronic module 14 in the presence of PCM material for different heat resistances between the PCM material and the substrate 100, the curves C23 to C27 represent the rise in temperature of the PCM material (linked to the curves C13 to C17). It is noticed that the phase change temperature Tf of the PCM material is slightly less than 120° C.

Yet as indicated previously, the function of the electronic module 14 is also to heat fuel. It eventuates that power peaks can generate excess heat and managing heat transfer is problematic.

Consequently, the PCM material, which has absorbed the heat peak, gives it back progressively to the exchanger 16a, 16b. In this way, the PCM material facilitates heat transfer between the electronic module 14 and the fuel.

In this way, the risks of vaporisation of said fuel are largely decreased.

Integrating PCM material into such heat exchange architecture between the electronic module 14 and the fuel circuit 15 puts up a heat barrier which diffuses heat over time and protects fuel from vaporisation, while protecting the module 14 from overheating. Furthermore, in contrast to conventional usage of PCM materials whereof the aim is simply to absorb heat over a relatively short time interval, the PCM material is used here as a radiator, from the power stored via the electronic module 14.

For this function to be fulfilled, a PCM material is selected whereof the phase change temperature Tf is less than the vaporisation temperature Tv of the fuel.

The following fuels are known, with their typical vaporisation starting temperatures Tv indicated in parentheses: JetA (180° C.), JP8 and JP8+100 (170° C.), JetA1 (170° C.), JP5 (200° C.), F76 (200° C.), TS1 (160° C.) and RT (160° C.).

For these fuels, a temperature Tf less than 150° C., preferably 140° C., more preferably less than or equal to 130° C. is suitable. In addition, the temperature Tf is above 120° C. to prevent the change of state from being completed, while the electronic module 14 has yet to reach temperatures which can compromise its operation.

The following fuels are also known, with their vaporisation temperature Tv in parentheses: JetB and JP4 (80° C.), AvGas and AutGas (60° C.).

For these fuels, a temperature Tf less than 50° C. is suitable.

Integrating PCM materials into the electronic module can be achieved in different ways, as shown in FIG. 2 which outlines three variants, not necessarily exclusive from each other.

In a first variant, the electronic components 110 are encapsulated in the PCM1 material. For this, a specific matrix comprising PCM material is utilised. This variant requires the electronic components 110 to be tight.

In a second variant, the PCM2 material can be integrated into the substrate 100. Document US2013/0147050 is especially known, which discloses such integration in the substrate 100. A specific volume must be made in the substrate 100.

In a third variant, a cold plate 120 is provided against the substrate 110, to the side opposite the electronic components 110. The cold plate 120 is therefore positioned between the heat exchanger 16 and the base substrate 100. The function of the cold plate 120 is to favour cooling the electronic module 14. The PCM3 material is integrated into this cold plate 120.

These three variants can be easily combined.

Different types of exchangers have been described previously. According to types of exchanger, the relative positioning of the fuel circuit and of the base substrate and/or of the cold plate can be adapted. In particular, the heat exchanger can be housed in the base substrate 100 or in the cold plate 120. The exchanger can then take the form of a fluid circuit, such as a pipe branching, arranged in the plate. The circulation of the fluid is preferably forced by a dedicated pump.

The PCM material can comprise hydrated salts, paraffins, and/or alcohols.

The advantage of PCM materials is also in the gain in mass and volume relative to other technologies.

In a particular embodiment, the electronic module 14 is a power module, configured to convert power supplied by the power source. It is therefore subject particularly to rises in temperatures, in particular over very short times when it is requested.

In this embodiment, the electronic components 110 can especially be power semi-conductors.

At present, broader architecture in terms of a helicopter will be described. Yet, the invention applies to any aircraft comprising electronics generating heat, irrespective of the number of engines or their type.

FIG. 4 illustrates a rotorcraft 1, more specifically a helicopter with a principal rotor 2 and an anti-torque tail rotor 3 coupled to a power unit 4 for their actuation. The power unit 4 illustrated comprises a first heat engine 5a and a second heat engine 5b. These heat engines 5a, 5b are turbine heat engines and more specifically turboengines whereof the power take-off shafts 6 are both connected to a principal gearbox 7 for actuating the principal rotor 2 and the tail rotor 3.

The power unit 4 is illustrated in more detail in FIG. 5. Each heat engine 5a, 5b comprises a compressor 8, a combustion chamber 9, a first turbine 10 connected via a rotary shaft 11 to the compressor 8 and a second turbine 12, or free turbine, coupled to the power take-off shaft 6. The assembly of the compressor 8, combustion chamber 9, first turbine 10 and rotary shaft 11 is also known by the name of "gas generator". The rotary shaft 11 of each gas generator is mechanically coupled to the power source 13a, 13b, which is more precisely an electric machine 13a, 13b generally in the form of an engine-generator, connected electrically to the electric module 14a, 14b, which is here an electronic power module, which is more specifically a power converter also connected electrically to an electric storage device 20 and an electrical network of the aircraft 1. This electric storage device 20 can for example be a battery, although other electric storage devices (such as fuel cells or flywheels) are also possible.

Electrical machines 13a, 13b serve both to start-up the corresponding heat engines 5a, 5b and to generate electricity after this start-up. In the first case, the electrical machine 13a, 13b functions in engine mode, and the electronic power module 14a, 14b ensures its electrical feed from the electrical network of the aircraft and/or the electrical storage device 20. In the second case, the electrical machine 13a, 13b operates in generator mode, and the electronic power module 14a, 14b adapts the generated current to appropriate voltage and amperage to supply the electrical network of the aircraft and/or of the electrical storage device 20.

Furthermore, however, each electrical machine 13a, 13b can also serve to maintain the corresponding heat engine 5a, 5b in standby mode, even during the flight of the aircraft 1, by turning its rotary shaft 11, with the combustion chamber 9 turned off, at a reduced Nstandby speed, which can be for example between 5 and 20% of a nominal speed N1 of the rotary shaft 11. In fact, it is known that keeping a turbine heat engine in standby mode on a multi-engine aircraft economizes on fuel when cruising and accelerates any restart-up.

The power supplied by the power unit 4 can vary substantially according to the flight stage of the aircraft 1. In this way, the power required for cruising speed is normally substantially less than the maximal continuous power of the power unit 4, and even less relative to its maximal take-off power. And, since the power unit 4 is dimensioned as a function of the latter, it is substantially oversized relative to the power required for cruising speed. As a consequence, in cruise, with the two heat engines 5a, 5b in operation, they could be far from their optimal operating speed, which would show up via by relatively high specific consumption. In principle, with a power unit comprising a plurality of heat engines, it is possible to maintain cruising speed with at least one of these heat engines turned off. With the other heat engines operating at a speed closer to their optimal speed, specific consumption can be reduced. To allow such an operating mode of a power unit, ensuring immediate start-up of the heat engine turned off, it has been proposed in FR 2 967 132 to keep this heat engine turned off in standby mode.

In the power unit 4 illustrated in FIG. 5, the first heat engine 5a is therefore turned off during cruising speed of the aircraft 1, whereas the second heat engine 5b supplies all the power to the principal rotor 2 and the tail rotor 3 via the principal gearbox 7. The electrical machine 13b connected to the second heat engine 5b simultaneously ensures supply of the electrical network of the aircraft 1 via its electronic power module 14b and supply of the electrical machine 13a via its electronics 14a. To be able to ensure emergency start-up of the first heat engine 5a, especially in the event of malfunction of the second heat engine 5b, the first heat engine 5a is kept in standby mode by actuation of its rotary shaft 11 by the corresponding electrical machine 13a, supplied via its electronic power module 14a.

To supply the heat engines 5a, 5b with fuel, each is connected to fuel supply circuits 15a, 15b, to the heat exchanger 16a, 16b and further to a fuel filter 17a,17b located downstream of the heat exchanger 16a,16b in the direction of flow of fuel towards the heat engine 5a, 5b.

As illustrated in FIG. 3, each heat exchanger 16a, 16b is adjacent to a base of the corresponding electronic power module 14a, 14b (for example a cold plate 21), in a casing 22, which can be tight and common to the electronic power module 14a, 14b and to the corresponding heat exchanger 16a, 16b, such that fuel circulating via the heat exchanger 16a or 16b can be heated by heat generated by operation of the electronic power module 14a, 14b, and simultaneously can contribute to cooling of the electronic power module 14a,14b, letting it operate in an optimal temperature range. Typically, each electronic power module 14a, 14b can process power Pe of the order of 100 kW, with heat losses of under 10%, resulting in caloric power Ph of less than 10 kW, or even less than 1 kW, for example.

However, each electronic power module 14a, 14b can have a normal operating mode and an operating mode with degraded electrical efficiency which can be implemented to generate extra heat for heating the fuel. This operating mode with degraded efficiency can be obtained for example by imposing on semi-conductors of the electronic power module 14a, 14b a higher cut-off frequency than that which would normally be applied as a function of the dimensioning criteria of standard electronics.

Each fuel supply circuit 15a, 15b can also comprise a bypass duct 18a, 18b of the heat exchanger 16a,16b, as well as a three-way valve 19a, 19b to control the flow of fuel via the heat exchanger 16a, 16b or by the bypass duct 18a, 18b.

To heat the fuel supplying one of the heat engines 5a, 5b during start-up of the latter at low temperature prior to igniting the combustion chamber 9, the fuel is directed via the corresponding heat exchanger 16a,16b, in which it is heated by way of heat generated by operation of the electronic power module 14a,14b via which the electrical machine 13a,13b is supplied electrically to turn the rotary shaft 11 of this heat engine 5a,5b. If the heat generated by the electronic power module 14a,14b in normal operating mode is insufficient to allow fast start-up without risk of clogging the fuel filter 17a,17b by particles of ice, an operating mode with degraded electrical efficiency of the electronic power module 14a,14b can be implemented to boost the heat generation in this module, and its transmission, via the heat exchanger 16a,16b, to the fuel.

By contrast, if it is not necessary to heat fuel for one or the other of the heat engines 5a,5b, or to cool the associated electronic power module 14a,14b, the three-way valve 19a, 19b can direct fuel via the corresponding bypass duct 18a, 18b.

The invention claimed is:

1. An assembly comprising:
a fuel supply circuit configured to supply a turbine heat engine with fuel,
an electronic module comprising electronic components on a substrate,
a power source for supplying the electronic module with electricity,
a heat exchanger positioned to allow heat to flow from the electronic module to the fuel supply circuit, the heat exchanger surrounding at least a portion of the fuel supply circuit and the substrate of the electronic module being mounted on the heat exchanger, and
a phase-change material configured to change state when a temperature of the phase-change material reaches a predetermined phase change temperature, the phase-change material being disposed on the substrate of the electronic module to cover the electronic components.

2. The assembly according to claim 1, wherein the predetermined phase change temperature is less than a vaporisation temperature of the fuel.

3. The assembly according to claim 1, wherein the electronic module is an electronic power module and is configured to convert the electricity supplied by the power source.

4. The assembly according to claim 1, wherein the predetermined phase change temperature is less than 150° C.

5. The assembly according to claim 1, wherein the electronic components are positioned on a first side of the substrate and the heat exchanger is positioned on a second side of the substrate, the second side being opposite the first side.

6. The assembly according to claim 5, wherein the electronic components are encapsulated in the phase-change material.

7. The assembly according to claim 5, wherein the phase-change material is integrated into the base substrate.

8. The assembly according to claim 5, wherein the electronic module comprises a cold plate and wherein the phase-change material is integrated into the cold plate.

9. A power unit comprising:
a turbine heat engine, and
the assembly according to claim 1,
wherein the fuel supply circuit is configured to supply the fuel to the turbine heat engine.

10. The power unit according to claim 9, wherein the power source is an electrical machine configured to operate as an engine or generator, and wherein the electrical machine is coupled mechanically to a rotating shaft of the heat engine.

11. A method for heating fuel using the assembly according to claim 1, the method comprising heating the fuel of the fuel supply circuit using the heat exchanger and the heat emitted by the electronic module via the phase-change material to the heat exchanger.

12. The assembly according to claim 1, wherein the predetermined phase change temperature is less than 140° C.

13. The assembly according, to claim 1, wherein the phase-change material is located and configured to absorb the heat from the electronic module and dissipate the heat to the heat exchanger.

14. The assembly according to claim 1, wherein the phase-change material is a first phase change material, and a second phase material is integrated into the substrate.

15. The assembly according to claim 14, further comprising a cold plate provided between the substrate and the heat exchanger, and a third phase-change material is integrated into the cold plate.

16. The assembly according to claim 1, further comprising a cold plate provided between the substrate and the heat exchanger, and the phase-change material is a first phase change material, and a second phase material is integrated into the cold plate.

17. The assembly according to claim 1, wherein the heat exchanger is mounted on the electronic module and is positioned between the fuel supply circuit and the electronic module.

\* \* \* \* \*